United States Patent
Ohnishi (10) Patent No.: US 9,708,732 B2
(45) Date of Patent: Jul. 18, 2017

(54) SUSCEPTOR WITH GROOVE PROVIDED ON BACK SURFACE AND METHOD FOR MANUFACTURING EPITAXIAL WAFER USING THE SAME

(75) Inventor: Masato Ohnishi, Nishishirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 685 days.

(21) Appl. No.: 13/985,592

(22) PCT Filed: Feb. 13, 2012

(86) PCT No.: PCT/JP2012/000928
§ 371 (c)(1),
(2), (4) Date: Aug. 15, 2013

(87) PCT Pub. No.: WO2012/120787
PCT Pub. Date: Sep. 13, 2012

(65) Prior Publication Data
US 2013/0319319 A1    Dec. 5, 2013

(30) Foreign Application Priority Data

Mar. 4, 2011 (JP) .................................. 2011-048159

(51) Int. Cl.
C30B 25/12    (2006.01)
C23C 16/458    (2006.01)
(Continued)

(52) U.S. Cl.
CPC .......... C30B 25/12 (2013.01); C23C 16/4581 (2013.01); C23C 16/4584 (2013.01);
(Continued)

(58) Field of Classification Search
CPC ......... C30B 25/00; C30B 25/02; C30B 25/12; C30B 25/16; C30B 25/165; C23C 16/458;
(Continued)

(56) References Cited

U.S. PATENT DOCUMENTS 6,893,507 B2 *   5/2005   Goodman ........... C23C 16/4581
                                                       118/715
2007/0119367 A1 *  5/2007   Kanaya ................... C30B 25/02
                                                       117/84
(Continued)

FOREIGN PATENT DOCUMENTS

CN       1526158 A     9/2004
JP       U-6-23240     3/1994
(Continued)

OTHER PUBLICATIONS

May 26, 2015 Office Action and Search Report issued in CN Patent Application No. 2012800117071.
(Continued)

*Primary Examiner* — Kenneth A Bratland, Jr.
(74) *Attorney, Agent, or Firm* — Oliff PLC (57) ABSTRACT

The present invention provides a susceptor for supporting a semiconductor substrate at the time of performing vapor-phase epitaxy of an epitaxial layer, wherein a pocket in which the semiconductor substrate is to be placed is formed on an upper surface of the susceptor, the pocket has a two-stage structure having an upper-stage-pocket portion for supporting an outer peripheral edge portion of the semiconductor substrate and a lower-stage-pocket portion that is formed on a central side of the pocket below the upper-stage-pocket portion, through holes that penetrate to a back surface of the susceptor and are opened at the time of performing the vapor-phase epitaxy are formed in the lower-stage-pocket portion, and a groove is provided on the back surface of the susceptor at a position corresponding to that of the upper-stage-pocket portion.

4 Claims, 7 Drawing Sheets

(51) Int. Cl.
　　*H01L 21/687*　　(2006.01)
　　*C30B 29/06*　　(2006.01)
(52) U.S. Cl.
　　CPC .......... *C23C 16/4586* (2013.01); *C30B 29/06* (2013.01); *H01L 21/68735* (2013.01)
(58) Field of Classification Search
　　CPC ............ C23C 16/4581; C23C 16/4582; C23C 16/4583; C23C 16/4584; C23C 16/4586; Y10T 117/00; Y10T 117/10; Y10T 117/1016
　　USPC ...................... 117/84, 88, 102, 200, 204, 911
　　See application file for complete search history.

(56) References Cited

U.S. PATENT DOCUMENTS

| | | | | |
|---|---|---|---|---|
| 2008/0110401 | A1* | 5/2008 | Fujikawa | C23C 16/4583 118/724 |
| 2009/0235867 | A1 | 9/2009 | Fujikawa et al. | |
| 2013/0180447 | A1* | 7/2013 | Ohnishi | C23C 16/4581 117/88 |

FOREIGN PATENT DOCUMENTS

| | | |
|---|---|---|
| JP | A-10-12364 | 1/1998 |
| JP | A-2001-10894 | 1/2001 |
| JP | A-2003-229370 | 8/2003 |
| JP | A-2009-252920 | 10/2009 |
| WO | WO 03/069029 A1 | 8/2003 |

OTHER PUBLICATIONS

Office Action issued in Japanese Patent Application No. 2011-048159 dated Oct. 8, 2013 (with partial translation).

International Preliminary Report on Patentability issued in International Patent Application No. PCT/JP2012/000928 dated Sep. 10, 2013.

International Search Report issued in International Patent Application No. PCT/JP2012/000928 dated Apr. 10, 2012.

Oct. 12, 2016 Office Action issued in Korean Patent Application No. 10-2013-7022547.

\* cited by examiner

SUSCEPTOR WITH GROOVE PROVIDED ON BACK SURFACE AND METHOD FOR MANUFACTURING EPITAXIAL WAFER USING THE SAME

TECHNICAL FIELD

The present invention relates to a susceptor and a method for manufacturing an epitaxial wafer, and more specifically to a susceptor that can reduce depositions produced on an outer periphery of a wafer back surface at the time of an epitaxial vapor-phase growth and a method for manufacturing an epitaxial wafer using the susceptor.

BACKGROUND ART

In epitaxial growth of a silicon wafer that is a semiconductor substrate, for the purpose of enhancing an outer periphery resistivity distribution or improving appearance of a back surface, a susceptor having through holes that penetrate to reach a susceptor back surface and are opened is often used (See Patent Document 1). Although the through holes provided in the susceptor have achieved various kinds of quality improvement, local depositions on an outer peripheral portion of a wafer back surface (hereinafter, referred to as "back surface depositions") are also produced.

Usually, a raw-material gas is allowed to flow to a wafer front side. The raw-material gas sometimes then flows into the back surface of the susceptor because of a mechanism of an epitaxial manufacturing apparatus. The raw-material gas that has flowed into the back surface side of the susceptor then flows into the back surface side of the wafer via the through holes of the susceptor and reacts on the back surface of the wafer; thus the back surface depositions are generated.

At this time, the back surface depositions of the wafer are locally generated in the vicinity of a contact portion of the susceptor and the wafer, i.e., an outer peripheral portion of the wafer back surface (in the case of a wafer having a diameter of 300 mm, a portion that is approximately 147 to 149 mm in radius from the center of the wafer), and a height thereof varies in accordance with a reaction time, but it reaches several hundred nanometers.

When flatness of the epitaxial wafer on which the back surface depositions have been produced is measured on the basis of the position of the back surface, the thickness of the epitaxial wafer precipitously increases at the outer peripheral portion, which results in flatness deterioration. In recent years, devices are miniaturized and high flatness is demanded even for a wafer outer peripheral portion, the back surface depositions can be a considerable obstacle for manufacture of latest products.

In conventional examples, the back surface depositions are intensively produced in a portion where a wafer and a susceptor are in contact with each other or they closely overlap each other, namely, a margin for mounting the susceptor, a back surface deposition height fluctuates in accordance with a thermal dose on the susceptor side, and hence a method for reducing the margin for mounting the susceptor as much as possible, a method for enlarging the margin for mounting the susceptor and continuously generating the back surface depositions, or a method for reducing lamp heating using a lamp on the lower side of the susceptor is mainly adopted in order to cope with the problem.

However, the above-described methods as the countermeasure are effective for the back surface depositions, but they have drawbacks, for example, slip dislocation is apt to occur, or nano-topology of the surface or an outer periphery resistivity distribution is deteriorated.

Further, there has been conventionally adopted a susceptor that can uniform a temperature distribution of a contact surface of the susceptor and a wafer by forming a groove near the susceptor center so that a high-frequency magnetic field can enter the susceptor from the groove and a high-temperature region can be formed near the susceptor at the time of heating a substrate by a CVD cold wall method using an induction heating susceptor (See Patent Document 2), or a susceptor that can increase an area for absorbing heat from a heater by forming many irregularities on the susceptor back surface (See Patent Document 3).

CITATION LIST

Patent Literatures

Patent Document 1: Japanese Unexamined Patent publication (Kokai) No. 2003-229370
Patent Document 2: Japanese Unexamined Patent publication (Kokai) No. H10-12364
Patent Document 3: Japanese Unexamined Utility Model publication No. H6-23240

SUMMARY OF INVENTION

Technical Problem

In a susceptor having a pocket formed into a two-stage structure including a portion for supporting an outer peripheral edge portion of a semiconductor substrate (which will be referred to as an upper-stage-pocket portion hereinafter) and a portion that is formed on the central side of the susceptor below the upper-stage-pocket and has the through holes (which will be referred to as a lower-stage-pocket portion hereinafter), since the substrate contacts the susceptor on an outer peripheral portion of the substrate, especially at the upper-stage-pocket portion, and the susceptor are close to other each at any portion other than the contact portion, it can be considered that the temperature at the outer peripheral portion is higher than that at an inner peripheral portion where the back surface depositions are less produced.

Therefore, in view of the above-described problems, on the assumption that the back surface depositions has a close relationship with a temperature environment between a substrate and a susceptor, it is an object of the present invention to provide a susceptor that reduces the temperature of the substrate outer peripheral portion at a position corresponding to that of the upper-stage-pocket portion on the back surface of the susceptor and equalizes thermal conditions at its outer peripheral portion and its inner peripheral portion on the substrate back surface so that production of back surface depositions on the substrate back surface can be suppressed, and to provide a method for manufacturing an epitaxial wafer that performs vapor-phase epitaxy of an epitaxial layer with this susceptor.

Solution to Problem

That is, the present invention provides a susceptor for supporting a semiconductor substrate at the time of performing vapor-phase epitaxy of an epitaxial layer, wherein a pocket in which the semiconductor substrate is to be placed is formed on an upper surface of the susceptor, the pocket has a two-stage structure having an upper-stage-pocket portion for supporting an outer peripheral edge portion of the semiconductor substrate and a lower-stage-pocket portion that is formed on a central side of the pocket below the upper-stage-pocket portion, through holes that penetrate to a back surface of the susceptor and are opened at the time of performing the vapor-phase epitaxy are formed in the lower-stage-pocket portion, and a groove is provided on the back surface of the susceptor at a position corresponding to that of the upper-stage-pocket portion.

With the susceptor having such a groove formed thereon, since the surface area of the susceptor back surface increases by a side area of the formed groove, heat radiation from the susceptor back surface increases. Furthermore, since a step is produced by forming the groove and a portion that is hidden from heating light from a heating means such as a lamp is produced, the temperature at the substrate outer peripheral portion is lowered, and the thermal conditions of the substrate outer peripheral portion and the substrate inner peripheral portion can be equalized. As a result, generation of the back surface depositions can be suppressed, and the nano-topology of the substrate surface and the outer periphery resistivity distribution can be improve to provide high quality.

Moreover, it is preferable that the groove includes a plurality of grooves each arranged radially.

According to the thus arranged grooves, the temperature at the substrate outer peripheral portion can be more efficiently and uniformly lowered, and the thermal conditions of the substrate outer peripheral portion and the substrate inner peripheral portion can be more assuredly equalized.

Additionally, each of the plurality of grooves arranged radially has preferably a length that is ¼ or less of a radius of the substrate in the radial direction of the substrate to be placed on the susceptor, a width of 5 mm or less, and a depth that is 75% or less of a thickness of the susceptor at a position corresponding to that of the upper-stage-pocket portion.

According to the thus formed grooves, the sufficient effects of the present invention can be obtained, and strength of the susceptor can be also maintained.

Further, the present invention provides a method for manufacturing an epitaxial wafer, wherein the susceptor according to any one of claims 1 to 3 is used to place a semiconductor substrate in the pocket of the susceptor, and vapor-phase epitaxy of an epitaxial layer is performed on the substrate while allowing a raw-material gas to flow.

When the vapor-phase epitaxy is performed in this manner, the temperature at the substrate outer peripheral portion can be lowered and thermal conditions of the outer peripheral portion and the inner peripheral portion on the substrate back surface can be equalized, and a high-quality epitaxial wafer can be manufactured by suppressing generation of the back surface depositions without deteriorating nano-topology of the substrate back surface and the outer periphery resistivity distribution.

Advantageous Effects of Invention

As described above, according to the present invention, at the time of performing the vapor-phase epitaxy of the epitaxial layer on the surface of the semiconductor substrate, the thermal conditions on the outer peripheral portion and the inner peripheral portion of the substrate can be equalized; therefore the susceptor that can suppress generation of the back surface depositions and improve the quality, such as nano-topology of the substrate and the outer periphery resistivity distribution, is provided. Further, when such a susceptor is used to perform the vapor-phase epitaxy of the epitaxial layer on the substrate surface, a high-quality epitaxial wafer on which generation of the back surface depositions are suppressed can be manufactured.

DESCRIPTION OF EMBODIMENTS

Embodiments of the present invention will now be described in detail by way of example with reference to the drawings, in which a silicon wafer is used as a semiconductor substrate. The present invention, however, is not restricted thereto, and can be likewise applied to the cases of using a compound semiconductor wafer such as a silicon carbide wafer, a GaP wafer, or a GaAs wafer.

Figure 1:
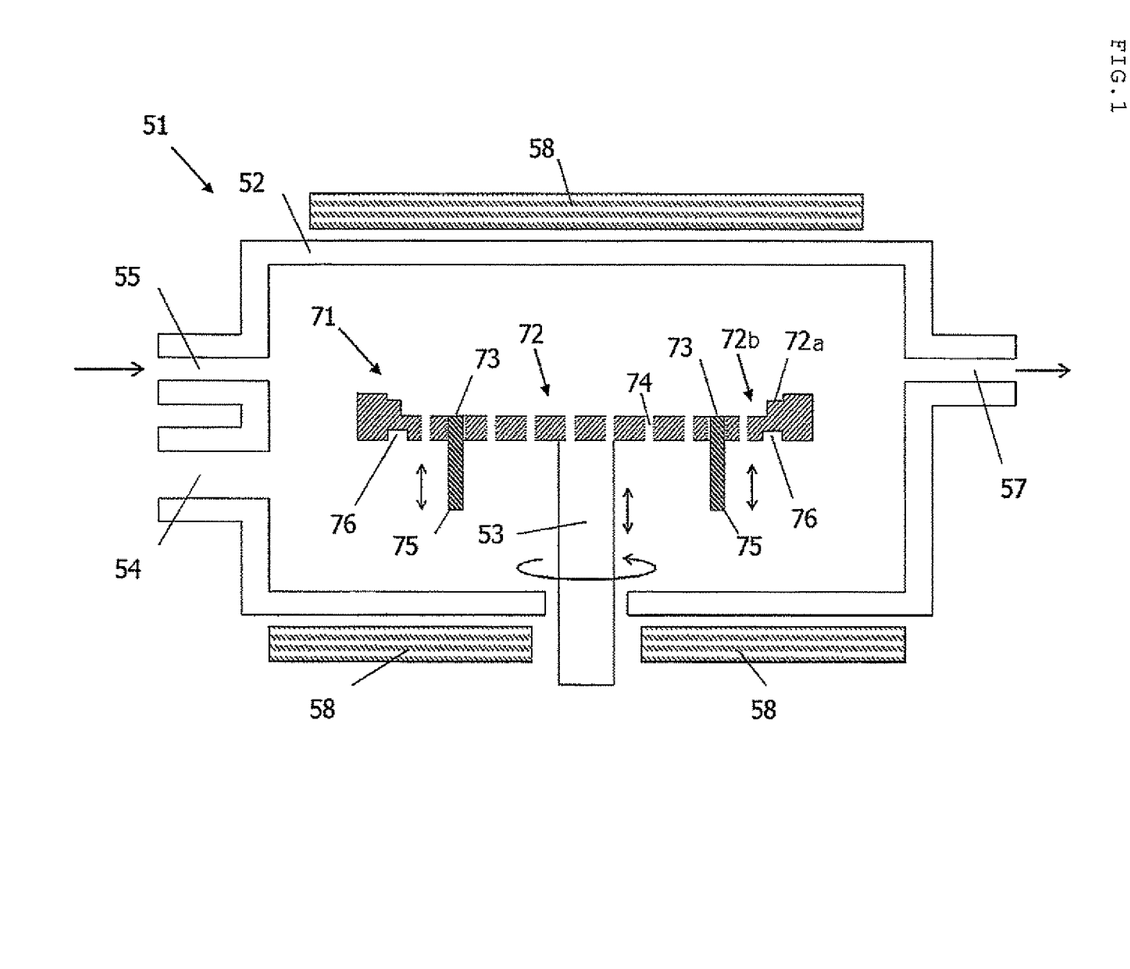
FIG. 1 shows an example of a schematic cross-sectional view of an epitaxial growth apparatus used in the present invention.

FIG. 1 is a schematic view showing an example of an epitaxial growth apparatus using a susceptor according to the present invention.

An epitaxial growth apparatus 51 is constituted of a chamber 52, a susceptor 71 arranged in the chamber, susceptor supporting means 53 that supports the susceptor from the lower side and is capable of rotating and moving up and down, a wafer carrying opening 54 through which a wafer is carried into the chamber 52 and carried to the outside, a gas introduction pipe 55 through which various kinds of gases are supplied into the chamber, non-illustrated hydrogen gas supplying means, connected to the gas introduction pipe 55, for supplying a hydrogen gas into the chamber, non-illustrated raw-material gas supplying means, connected to the gas introduction pipe 55, for supplying a raw-material gas such as silane, a gas discharge pipe 57 through which various kinds of gases are discharged from the chamber, heating means 58 provided outside the chamber 52, non-illustrated wafer transferring means for transferring a silicon wafer into the chamber and transferring the silicon wafer from the chamber 52, and others.

It is to be noted that lift pin through holes 73 may be formed in the susceptor 71. A lift pin 75 is inserted into each lift pin through hole 73.

Moreover, lift pin elevating means that can relatively move up and down each lift pin 75 with respect to the susceptor may be provided in the chamber 52.

Figure 2:
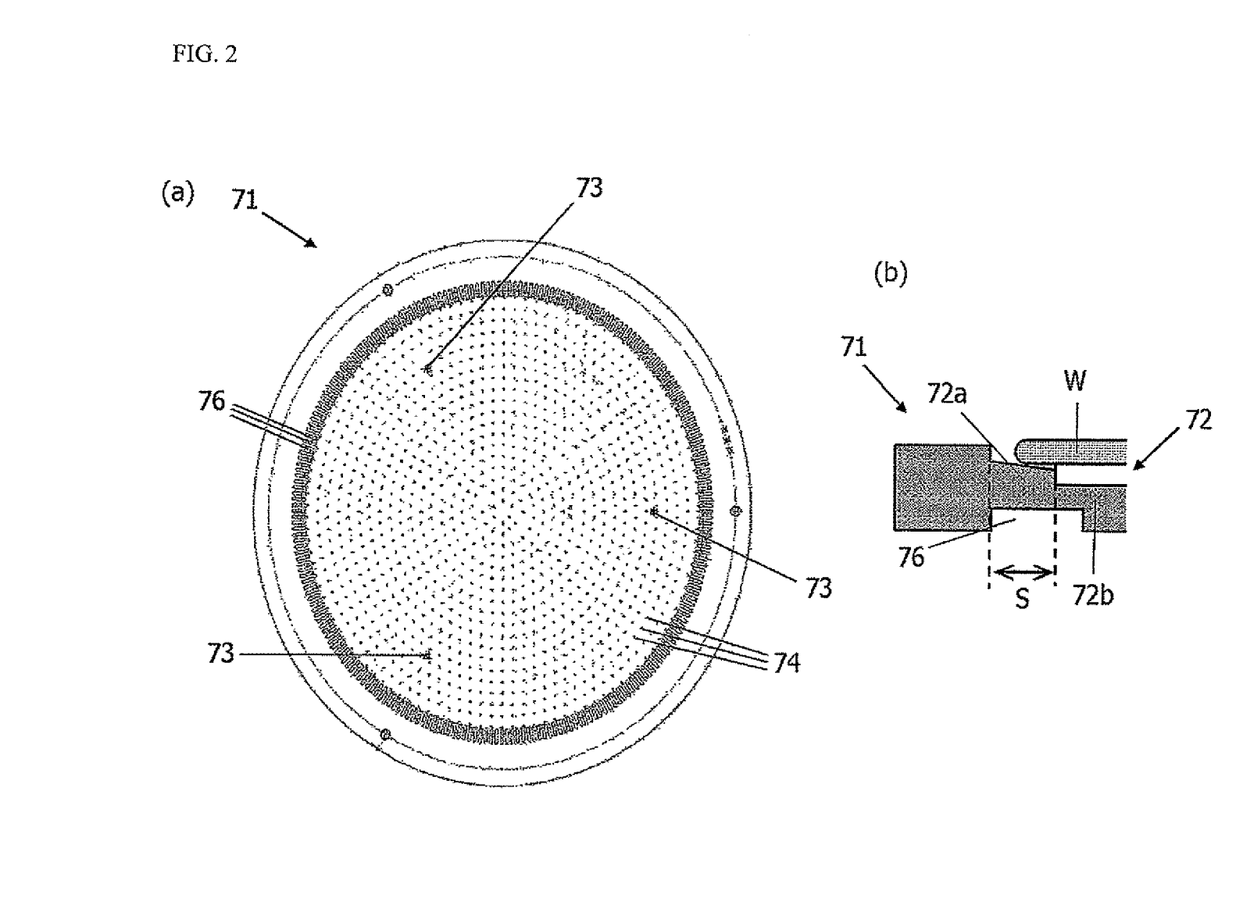
FIG. 2 shows an example of a schematic bottom view of a susceptor and a schematic cross-sectional view of an upper-stage-pocket portion and its surrounding area according to the present invention.

Furthermore, FIG. 2 shows an enlarged schematic view of the susceptor 71 according to the present invention. A pocket 72 for positioning of a silicon wafer to be placed is formed on the susceptor 71, and the pocket 72 has a two-stage structure having an upper-stage-pocket portion 72a that supports an outer peripheral edge portion of a wafer W and a lower-stage-pocket portion 72b formed below the upper-stage-pocket portion and on the center side of the pocket. Furthermore, many through holes 74 are formed in a substantially entire surface of the lower-stage-pocket portion 72b.

Moreover, grooves 76 are provided on the back surface of the susceptor 71 at a position corresponding to that of the upper-stage-pocket portion 72a.

Since the grooves 76 are provided, the surface area of the back surface of the susceptor 71 at a position corresponding to that of the upper-stage-pocket portion 72b, shown by 'S' in FIG. 2 at (b), increases, and heat radiation from the back surface of the wafer W increases. Additionally, a portion that is hidden from heating light from a heating means 58 such as a lamp is also produced, the temperature at the outer peripheral portion of the wafer W lowers, and thermal conditions of the outer peripheral portion and the inner peripheral portion of the wafer W can be equalized. As a result, generation of back surface depositions can be suppressed, and nano-topology of a main surface of the wafer W and an outer periphery resistivity distribution can be prevented from being deteriorated.

Radially providing a plurality of such grooves 76 along a radial direction as shown in FIG. 2 at (a) enables uniformly and effectively increasing the surface area of the back surface of the susceptor 71 corresponding to the outer peripheral portion of the back surface of the wafer W, which is preferable. This is more effective when each of the plurality of radially provided grooves 76 has a length that is ¼ or less of the wafer radius in the radial direction of the wafer W, a width of 5 mm or less, and a depth that is 75% or less of the thickness of the susceptor 71 at a position corresponding to that of the upper-stage-pocket portion 72a.

It is to be noted that each groove 76 is not restricted to a prismatic groove as shown in FIG. 2 at (a), and it may be a cylindrical or semispherical groove. Furthermore, although one large, ring groove may be provided in the susceptor 71 so as to include the entire portion at a position corresponding to that of the upper-stage-pocket portion 72a, providing the plurality of grooves as described above is more effective, and problems in strength of the susceptor hardly occur.

The epitaxial growth apparatus 51 including such a susceptor 71 is used to grow an epitaxial layer on a silicon wafer surface by the vapor-phase epitaxy.

Figure 7:
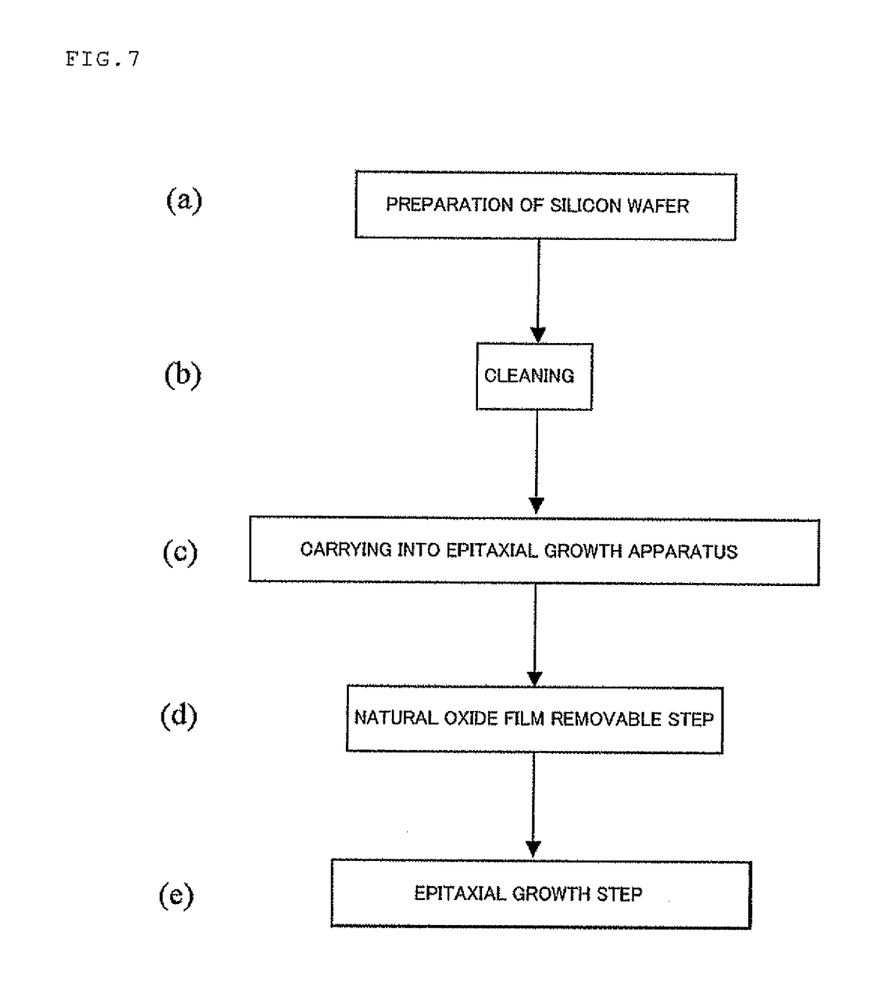
FIG. 7 is a flowchart showing a flowchart of a method for manufacturing an epitaxial wafer of the present invention.

FIG. 7 shows a flowchart of a method for manufacturing an epitaxial wafer of the present invention.

First, at a step (a), a semiconductor substrate (a silicon wafer) on which an epitaxial layer is to be grown is prepared.

Next, at a step (b), cleaning such as RCA cleaning is appropriately performed on the silicon wafer.

As a cleaning method in this cleaning step, besides the typical RCA cleaning, a method in which concentration or a type of a chemical solution is changed in the normally available range can be used.

Then, at a step (c), non-illustrated wafer transferring means is used to transfer a silicon wafer W into the chamber 52, and the silicon wafer is placed on the pocket 72 of the susceptor 71 of the invention. As a method for placing the silicon wafer on the susceptor 71, it is possible to apply a normally used placing method as well as a method using the lift pins 75.

Then, at a step (d), a hydrogen gas is introduced into the chamber 52 from the hydrogen gas supplying means through the gas introduction pipe 55, the interior of the chamber is heated by the heating means 58 for hydrotreating, so that a natural oxide film produced on the silicon wafer front surface is removed.

Then, at a step (e), the vapor-phase epitaxy of the epitaxial layer is performed on the front surface of the silicon wafer. This vapor-phase epitaxy of the epitaxial layer is performed by introducing a raw-material gas such as monosilane, trichlorosilane, and silicon tetrachloride and the hydrogen gas which is used as a carrier gas into the chamber 52 and heating the interior of the chamber.

In this manner, the epitaxial wafer having the epitaxial layer formed on the front surface of the silicon wafer can be manufactured.

At this time, in the present invention, since the susceptor having the grooves on the back surface at the position corresponding to that of the upper-stage-pocket portion is used, the back surface depositions at the wafer outer peripheral portion can be suppressed; a high-quality epitaxial wafer can be manufactured.

EXAMPLE

Although the present invention will now be more specifically explained based on an experimental example, an example, and a comparative example, but the present invention is not restricted thereto.

Here, a description will be given as to WaferSight (manufactured by KLA-Tencor Corporation) and UA3P (manufactured by Panasonic Corporation) that were used as apparatuses for evaluating a film thickness of an epitaxial wafer and back surface depositions of a silicon wafer in each of the following Experimental Example, Example, and Comparative Example.

WaferSight is a measuring instrument that measures, in principle, a displacement of the wafer front surface from the number and width of interference fringes produced due to optical interference of reflected light from the wafer and reflected light from a reference surface when light is allowed to enter the wafer. In the actual measurement, both the wafer surfaces are measured, and a change in entire thickness is calculated from the thickness of one specific point measured in advance.

Furthermore, UA3P is a measuring instrument that conducts measurement on the basis of a contact surface displacement. It presses a probe against a target under a small constant load and measures with a laser a displacement of the probe that fluctuates in accordance with irregularities of the target in principle.

Experimental Example

First, susceptors were prepared: a susceptor that has no groove on its susceptor back surface, a susceptor that has a plurality of grooves on the susceptor back surface at a position corresponding to that of the upper-stage-pocket portion, and thereby has, at its outer peripheral portion of the back surface, surface area three times larger than the susceptor that has no groove, and a susceptor that has, at its outer peripheral portion on the back surface, surface area five times larger than the susceptor that has no groove likewise.

With three pieces of epitaxial wafer manufacturing apparatus each having these susceptors, 300-mm-diameter silicon wafers as semiconductor substrates were each placed in pockets of the susceptors, and heated with lamps while introducing a raw-material gas to grow an epitaxial layer having a thickness of 5 µm on the silicon wafer surface by vapor-phase epitaxy.

At this time, the grooves each formed into a rectangular parallelepiped shape having a length of 10 mm in a wafer radial direction, a width of 2 mm, and a depth of 2 mm were arranged radially. Moreover, the reaction pressure was a normal pressure, the reaction temperature was 1100° C., and the growth rate was 2.5 µm/min.

At this time, variations in wafer thickness before and after formation of the epitaxial layer of the epitaxial wafers, manufactured by the epitaxial wafer manufacturing apparatuses each having the susceptors, were measured by WaferSight at two points of 147 mm and 149 mm from the center of the silicon wafer in the radial direction, that is, at positions corresponding to the susceptor back surface where the grooves according to the present invention were provided. A difference between these values at the two points (variations in wafer thickness before and after formation of the epitaxial layer) was then calculated. The results are shown in FIG. 3.

Additionally, a deposition height on the back surface of the silicon wafer in the above range was measured by using UA3P. The results are shown in FIG. 4.

Figure 3:
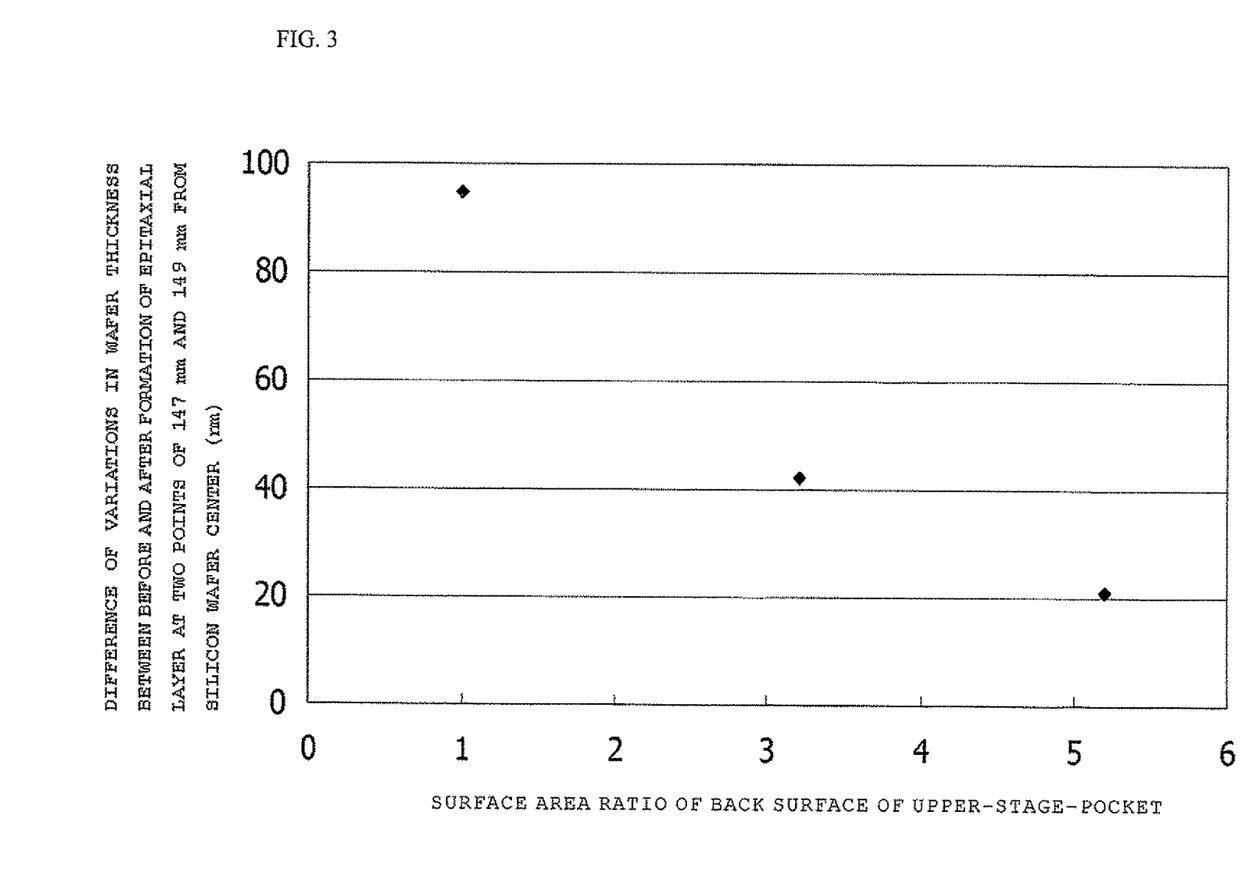
FIG. 3 shows a correlation between a surface area ratio (when a surface area without a groove is defined as 1) at a position corresponding to that of the upper-stage-pocket portion on a susceptor back surface and an elevation difference of a thickness of an epitaxial layer at an outer peripheral portion of a manufactured epitaxial wafer.
Figure 4:
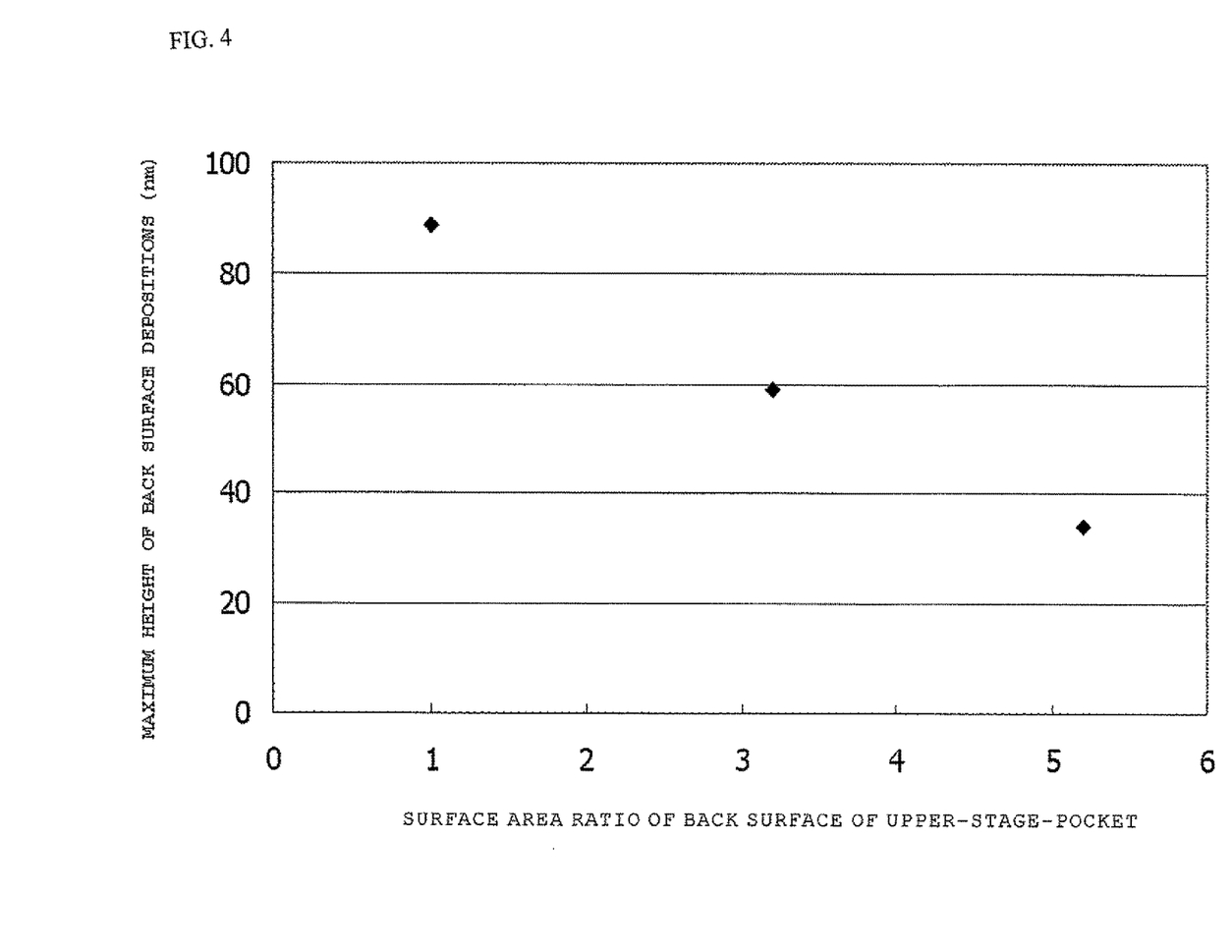
FIG. 4 shows a correlation between a surface area ratio (when a surface area without a groove is defined as 1) at a position corresponding to that of the upper-stage-pocket portion on the susceptor back surface and a maximum height of the back surface depositions after the vapor-phase epitaxy of the epitaxial layer on the semiconductor substrate.

It can be understood from FIG. 3 and FIG. 4 that the surface area of the susceptor back surface at the position corresponding to the upper-stage-pocket portion and the height of the back surface depositions produced have a correlation. It can be considered that the correlation was caused because heat radiation from the increasing surface area on the susceptor back surface increased and the provided grooves produced a portion that was hidden from heating light from the lamp.

Example

With an epitaxial wafer manufacturing apparatus provided with a susceptor having grooves on the back surface at a position corresponding to that of the upper-stage-pocket portion, a 300-mm-diameter silicon wafer as a semiconductor substrate was placed in the pocket of the susceptor, and heated with a lamp while introducing a raw-material gas to grow an epitaxial layer having a thickness of 5 µm on the silicon wafer surface by vapor-phase epitaxy.

At this time, 240 grooves each formed into a rectangular parallelepiped shape having a length of 10 mm in a wafer radial direction, a width of 2 mm, and a depth of 2 mm were arranged radially. Moreover, the reaction pressure was a normal pressure, the reaction temperature was 1100° C., and the growth rate was 2.5 µm/min.

Figure 5:
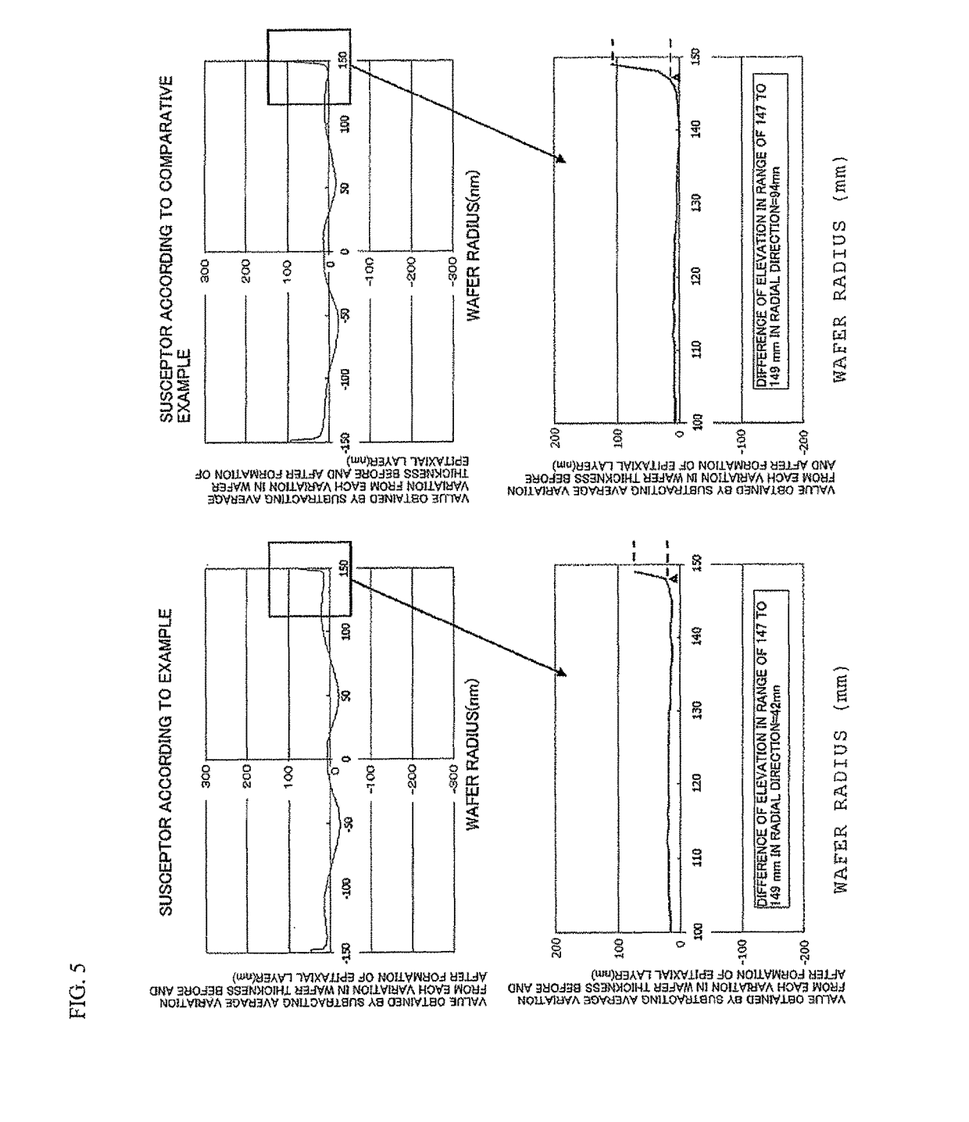
FIG. 5 shows results of performing measurement using WaferSight in Example and Comparative Example.

At this time, variations in wafer thickness before and after formation of the epitaxial layer of the epitaxial wafer, manufactured by the epitaxial wafer manufacturing apparatus having the susceptor, were measured by WaferSight in the range between 147 mm and 149 mm from the center of the silicon wafer in the radial direction, that is, in the range corresponding to a portion of the susceptor back surface where the grooves according to the present invention were provided. Then differences between these values at each measurement points and the average variation were calculated. The results are shown in FIG. 5.

Figure 6:
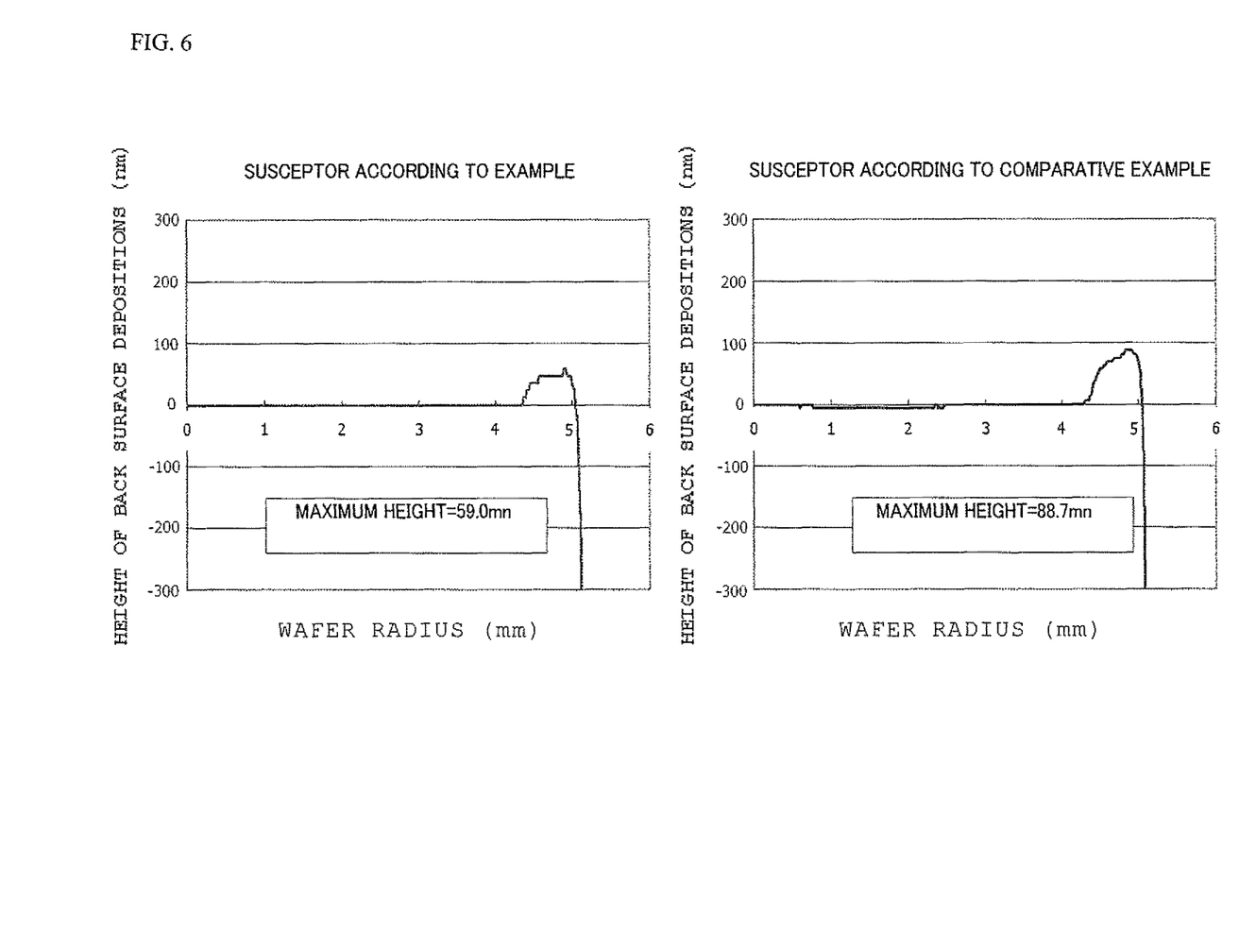
FIG. 6 shows results of performing measurement using UA3P in Example and Comparative Example.

Additionally, a deposition height on the back surface of the silicon wafer in the above range was measured by using UA3P. The results are shown in FIG. 6.

Comparative Example

Except that grooves were not provided on a susceptor back surface at a position corresponding to that of the upper-stage-pocket portion, an epitaxial layer having a thickness of 5 µm was grown on a surface of a silicon wafer having a diameter of 300 mm by vapor-phase epitaxy as with Example.

At this time, variations in wafer thickness before and after formation of the epitaxial layer of the epitaxial wafer, manufactured by the epitaxial wafer manufacturing apparatus having the susceptor, were measured by WaferSight in the range between 147 mm and 149 mm from the center of the silicon wafer in the radial direction. Then differences between these values at each measurement points and the average variation were calculated. The results are shown in FIG. 5.

Additionally, a deposition height on the back surface of the silicon wafer in the above range was measured by using UA3P. The results are shown in FIG. 6.

As understood from Example and Comparative Example, the grooves are provided on the susceptor back surface at the position corresponding to the upper-stage-pocket portion to increase the surface area of the susceptor back surface, and a portion that is hidden from heating light from the lamp is produced to lower the temperature at the outer peripheral portion of the wafer; thereby thermal conditions of the outer peripheral portion and the inner peripheral portion of the wafer can be equalized, and generation of the back surface depositions can be effectively suppressed. As a result, a high-quality epitaxial wafer can be manufactured without deteriorating the nano-topology of the wafer surface and the outer periphery resistivity distribution.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A susceptor for supporting a semiconductor substrate at the time of performing vapor-phase epitaxy of an epitaxial layer, wherein a pocket in which the semiconductor substrate is to be placed is formed on an upper surface of the susceptor, the pocket has a two-stage structure having an upper-stage-pocket portion for supporting an outer peripheral edge portion of the semiconductor substrate and a lower-stage-pocket portion that is formed on a central side of the pocket below the upper-stage-pocket portion, through holes that penetrate to a back surface of the susceptor and are opened at the time of performing the vapor-phase epitaxy are formed in the lower-stage-pocket portion, and a groove is provided entirely upon the back surface of the susceptor at a position corresponding to that of the upper-stage-pocket portion, the groove being elongate in a direction parallel to the back surface of the susceptor, wherein:

the groove is provided at least along the entire region corresponding to the position of the upper-stage-pocket portion;

the groove includes a plurality of grooves arranged along an entire periphery of the susceptor, each of the plurality of grooves being arranged radially;

each of the plurality of grooves arranged radially has a length that is ¼ or less of a radius of the substrate in the radial direction of the substrate to be placed on the susceptor, a width of 5 mm or less, and a depth that is 75% or less of a thickness of the susceptor at a position corresponding to that of the upper-stage-pocket portion; and the plurality of grooves causes the surface area of the susceptor back surface at a position corresponding to the upper-stage-pocket portion to be at least three times more than that of a susceptor having no grooves.

2. A method for manufacturing an epitaxial wafer, wherein the susceptor according to claim 1 is used to place a semiconductor substrate in the pocket of the susceptor, and vapor-phase epitaxy of an epitaxial layer is performed on the substrate while allowing a raw-material gas to flow.

3. The susceptor according to claim 1, wherein each of the plurality of grooves extends radially on the back surface of the susceptor over at least the entire radial span corresponding to the upper-stage-pocket portion.

4. The susceptor according to claim 3, wherein each of the plurality of grooves further extends radially on the back surface of the susceptor over a radial span corresponding to at least a portion of the lower-stage-pocket portion.

* * * * *